(12) United States Patent
Morihara et al.

(10) Patent No.: US 11,982,941 B2
(45) Date of Patent: May 14, 2024

(54) FLEXOGRAPHIC PRINTING PLATE PRECURSOR

(71) Applicant: Sumitomo Riko Company Limited, Aichi (JP)

(72) Inventors: Koji Morihara, Aichi (JP); Hideyuki Hashimoto, Aichi (JP); Daisuke Inoue, Aichi (JP); Koki Matsuoka, Aichi (JP); Yasuyuki Hayasaki, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 529 days.

(21) Appl. No.: 16/845,096

(22) Filed: Apr. 10, 2020

(65) Prior Publication Data

US 2020/0241416 A1  Jul. 30, 2020

Related U.S. Application Data

(63) Continuation of application No. PCT/JP2018/039841, filed on Oct. 26, 2018.

(30) Foreign Application Priority Data

Dec. 26, 2017  (JP) ................ 2017-248644

(51) Int. Cl.
*G03F 7/033* (2006.01)
*B41N 1/00* (2006.01)

(52) U.S. Cl.
CPC .............. *G03F 7/033* (2013.01); *B41N 1/00* (2013.01)

(58) Field of Classification Search
CPC .................. G03F 7/033; B41N 1/00
See application file for complete search history.

(56) References Cited

U.S. PATENT DOCUMENTS

2010/0297558 A1* 11/2010 Becker ............... B41C 1/05
522/121
2012/0288682 A1* 11/2012 Inoue ................ G03F 7/032
430/286.1

(Continued)

FOREIGN PATENT DOCUMENTS

JP  2009298104     12/2009
JP  2009298104 A * 12/2009
JP  5325823       10/2013

OTHER PUBLICATIONS

English machine translation of JP-2009298104-A (Dec. 2009) (Year: 2009).*

(Continued)

*Primary Examiner* — Peter L Vajda
*Assistant Examiner* — Jayson D Cosgrove
(74) *Attorney, Agent, or Firm* — JCIPRNET (57) ABSTRACT

Provided is a flexographic printing plate precursor which can suppress chipping of relief images while maintaining printing properties. The flexographic printing plate precursor (10) includes a photosensitive layer (16) which includes (A) a water-dispersed latex, (B) a millable rubber, (C) a surfactant, (D) photopolymerizable compounds, and (E) a photopolymerization initiator, the (D) including the following (d1) to (d3). (d1) is a photopolymerizable compound of a chain structure having no cyclic structure, (d2) is a monofunctional photopolymerizable compound having a cyclic structure, and (d3) is a bifunctional photopolymerizable compound having a cyclic structure.

5 Claims, 1 Drawing Sheet

(56) References Cited

U.S. PATENT DOCUMENTS

2014/0370440 A1* 12/2014 Yamada .................. B41N 1/12
　　　　　　　　　　　　　　　　　　　　　　430/281.1
2016/0183659 A1*  6/2016 Tashiro .................. A61K 8/19
　　　　　　　　　　　　　　　　　　　　　　132/200

OTHER PUBLICATIONS

"Office Action of China Counterpart Application", issued on May 12, 2021, with English translation thereof, p. 1-p. 8.
"Written Opinion of the International Searching Authority (Form PCT/ISA/237)" of PCT/JP2018/039841, mailed on Jan. 22, 2019, with English translation thereof, pp. 1-9.
"International Search Report (Form PCT/ISA/210) of PCT/JP2018/039841," mailed on Jan. 22, 2019, with English translation thereof, pp. 1-4.

* cited by examiner

FLEXOGRAPHIC PRINTING PLATE PRECURSOR

CROSS-REFERENCE TO RELATED APPLICATIONS

This application is a continuation application of International Application number PCT/JP2018/039841 on Oct. 26, 2018, which claims the priority benefit of Japan Patent Application No. 2017-248644, filed on Dec. 26, 2017. The entirety of each of the above-mentioned patent applications is hereby incorporated by reference herein and made a part of this specification.

BACKGROUND

Technical Field

The disclosure relates to a flexographic printing plate precursor, more specifically, to a flexographic printing plate precursor developed by water development.

Related Art

Conventionally, letterpress printing, intaglio printing, or lithographic printing is performed on a printed object such as a packaging material, a label, a magazine or the like using a printing plate. In particular, the letterpress printing is performed using letterpress. In the letterpress, because a material is soft, there is a flexographic printing plate which can be applied to various printed objects without selecting a printed object.

The flexographic printing plate precursor includes a photosensitive layer made of a photosensitive composition on a substrate such as a PET resin or the like. In the flexographic printing plate, for example, relief images are formed by irradiating the photosensitive layer with ultraviolet rays via a negative film adhered to the photosensitive layer and removing an uncured part. As a development method for removing the uncured part, a water development method using an aqueous developing liquid as a medium is known.

For example, in Japanese Patent No. 5325823, a flexographic printing plate precursor is recited in which a photosensitive layer is formed using a photosensitive composition including (A) a water-dispersed latex, (B) a rubber, (C) a surfactant, (D) a photopolymerizable monomer, and (E) a photopolymerization initiator and water development is performed using an aqueous developing liquid.

In the flexographic printing plate precursor of Japanese Patent No. 5325823, there is a problem that after the flexographic printing plate is produced and printing is performed, the relief images are chipped at the time of ink wiping. The reason is that the photosensitive layer in patent literature 1 uses a mixture of a water-dispersed latex and a rubber as a matrix polymer and strength at an interface between the water-dispersed latex and the rubber is low.

SUMMARY

The disclosure provides a flexographic printing plate precursor which can suppress chipping of relief images while maintaining printing properties.

The flexographic printing plate precursor according to the disclosure has a photosensitive layer, wherein the photosensitive layer includes (A) a water-dispersed latex, (B) a millable rubber, (C) a surfactant, (D) photopolymerizable compounds, and (E) a photopolymerization initiator, and the (D) including the following (d1) to (d3).

(d1) a photopolymerizable compound of a chain structure having no cyclic structure
(d2) a monofunctional photopolymerizable compound having a cyclic structure
(d3) a bifunctional photopolymerizable compound having a cyclic structure
(d1) is a compound represented by formula (1), in the formula (1), $R^1$ represents a hydrogen group or a methyl group, $R^2$ represents a hydrogen group or a methyl group, and $R^3$ represents a linear or branched hydrocarbon group having a carbon number of 4 to 12.

DESCRIPTION OF THE EMBODIMENTS

Next, the disclosure is described specifically.

Figure 1:
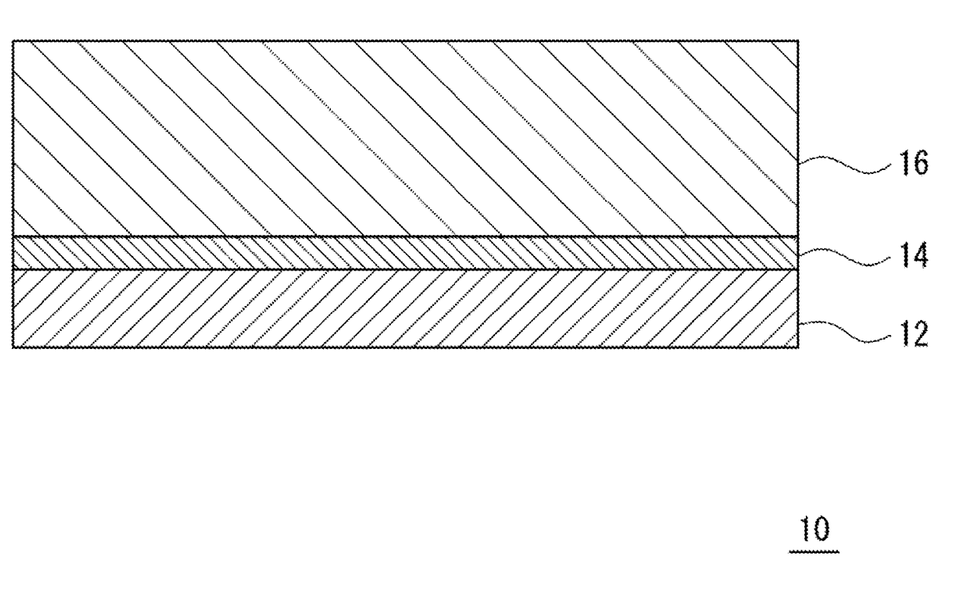
FIG. 1 is a cross-section view of a flexographic printing plate precursor according to one embodiment of the disclosure.

A flexographic printing plate precursor according to the disclosure is a flexographic printing plate precursor in which development is performed by water development, and has a photosensitive layer. FIG. 1 is a cross-section view of the flexographic printing plate precursor according to one embodiment of the disclosure. As shown in FIG. 1, the flexographic printing plate precursor 10 according to one embodiment of the disclosure includes a substrate 12 and a photosensitive layer 16 formed on the substrate 12. The photosensitive layer 16 is laminated on the substrate 12 via an adhesive layer 14 composed of an adhesive agent and the like. Furthermore, in the disclosure, as long as adhesiveness between the substrate 12 and the photosensitive layer 16 is sufficiently secured, a configuration without the adhesive layer 14 may be used.

The substrate 12 is not particularly limited as long as the substrate 12 has a strength capable of supporting the photosensitive layer 16, and the substrate 12 may be a plastic film such as a PET film (or a plastic sheet), a sheet made of metal such as stainless steel or aluminum, a sheet made of rubber such as a butadiene rubber or the like.

The photosensitive layer 16 is configured by a photosensitive composition, and a part irradiated by light such as ultraviolet rays is cured. The photosensitive layer 16 includes (A) a water-dispersed latex, (B) a millable rubber, (C) a surfactant, (D) photopolymerizable compounds, and (E) a photopolymerization initiator.

The (A) water-dispersed latex is polymer particles obtained by removing water from water dispersion in which polymer particles are dispersed in water as a dispersoid, and is configured by fine particles of about 0.1 to 1 μm. The water-dispersed latex exists in the form of fine particles even in the photosensitive layer 16, and at the time of the water development, the fine particles of the water-dispersed latex included in an uncured part are removed together with the other components using an aqueous developing liquid as a medium. The water-dispersed latex can give the photosensitive layer 16 water developability.

The (B) millable rubber is a rubber which is solid at room temperature. The millable rubber can secure the strength required by the printing plate by being included in the composition. In addition, rubber elasticity of the photosensitive layer 16 can be increased. Thereby, for example, an effect that printing can be easily performed on various printed objects or the like can be expected. A hydrophobic rubber is used as the millable rubber.

The water-dispersed latex and the millable rubber are binder polymers in the photosensitive layer 16 and are main components. By using both the water-dispersed latex and the millable rubber as the binder polymers, the strength required by the printing plate can be ensured, and excellent water developability can be exhibited.

A ratio of the water-dispersed latex and the millable rubber can be appropriately set in consideration of the water developability and the strength required by the printing plate. A proportion of the water-dispersed latex is preferably within a range of 20 to 90 mass % with respect to a total amount of the water-dispersed latex and the millable rubber. More preferably, the proportion is within a range of 30 to 80 mass %, and further preferably, within a range of 50 to 70 mass %. If the proportion of the water-dispersed latex is 20 mass % or more with respect to the above total amount, permeability of the aqueous developing liquid into the photosensitive layer 16 is high, a water development speed is excellent, and the water development can be performed at a high speed. In addition, if the proportion of the water-dispersed latex is 90 mass % or less with respect to the above total amount, image reproducibility is excellent.

Specifically, the water-dispersed latex may be a water-dispersed latex polymer such as a polybutadiene latex, a natural rubber latex, a styrene-butadiene copolymer latex, an acrylonitrile-butadiene copolymer latex, a polychloroprene latex, a polyisoprene latex, a polyurethane latex, a methyl methacrylate-butadiene copolymer latex, a vinylpyridine polymer latex, a butyl polymer latex, a thiocol polymer latex, or an acrylate polymer latex, a polymer which is obtained by copolymerizing the above polymers with other components such as acrylic acid, methacrylic acid or the like, etc. These latexes may be used alone as the water-dispersed latex, or two or more latexes may be used in combination.

In particular, from the viewpoint of hardness or the like, a water-dispersed latex polymer including a butadiene skeleton or isoprene skeleton in a molecular chain is preferable. Specifically, the polybutadiene latex, the styrene-butadiene copolymer latex, the acrylonitrile-butadiene copolymer latex, the methyl methacrylate-butadiene copolymer latex, an acrylic acid-methyl methacrylate-butadiene copolymer latex, and the polyisoprene latex are preferable.

Specifically, the millable rubber may be a butadiene rubber (BR), a nitrile rubber (NBR), an acrylic rubber, an epichlorohydrin rubber, a urethane rubber, an isoprene rubber, a styrene isoprene rubber, a styrene butadiene rubber, an ethylene-propylene copolymer, a chlorinated polyethylene or the like. These rubbers may be used alone as the millable rubber, or two or more rubbers may be used in combination.

In particular, from the viewpoint of being capable of improving the water developability, a drying property, and the image reproducibility of the photosensitive layer 16, the butadiene rubber (BR) and the nitrile rubber (NBR) are preferable. Furthermore, from the viewpoint that the rubber components are particularly finely dispersed in the photosensitive layer 16, thereby being excellent in reproducibility of a fine shape and capable of further improving the image reproducibility or the like, the butadiene rubber (BR) is preferable.

The (C) surfactant can improve the water developability of the photosensitive layer 16. The surfactant may be a cationic surfactant, an anionic surfactant, or a nonionic surfactant. Among these surfactants, the anionic surfactant is particularly preferable.

Specifically, the anionic surfactant may be aliphatic carboxylate such as sodium laurate or sodium oleate, higher alcohol sulfate such as sodium lauryl sulfate, sodium cetyl sulfate or sodium oleyl sulfate, polyoxyethylene alkyl ether sulfate such as sodium polyoxyethylene lauryl ether sulfate, polyoxyethylene alkyl allyl ether sulfate such as sodium polyoxyethylene octylphenyl ether sulfate or sodium oxyethylene nonylphenyl ether sulfate, alkyl sulfonate such as alkyl diphenyl ether disulfonate, sodium dodecyl sulfonate, or sodium dialkyl sulfosuccinate, alkyl allyl sulfonate such as alkyl disulfonate, sodium dodecylbenzene sulfonate, sodium dibutyl naphthalene sulfonate, or sodium triisopropyl naphthalene sulfonate, higher alcohol phosphate such as disodium lauryl phosphate monoester or sodium lauryl phosphate diester, polyoxyethylene alkyl ether phosphate such as polyoxyethylene lauryl ether phosphate monoester disodium or polyoxyethylene lauryl ether phosphate diester sodium or the like. These surfactants may be used alone, or two or more surfactants may be used in combination. Furthermore, sodium salts are mentioned as specific examples, but it is not particularly limited to the sodium salts, similar effects can be obtained with calcium salts, ammonia salts, and the like.

In particular, from the viewpoint of being more excellent in an improvement effect of the water developability of the photosensitive layer 16 or the like, a sulfonic acid surfactant such as alkyl sulfonate or alkyl allyl sulfonate is preferable.

A content of the surfactant in the photosensitive layer 16 is preferably within a range of 0.1 to 20 mass % with respect to a total of the (A) to the (C). The content is more preferably within a range of 0.1 to 15 mass %, and further preferably within a range of 0.1 to 10 mass %. If the content of the surfactant is 0.1 mass % or more with respect to the total of the (A) to the (C), the permeability of the aqueous developing liquid into the photosensitive layer 16 is high, the water development speed is excellent, and the water development can be performed at a high speed. In addition, if the content of the surfactant is 20 mass % or less with respect to the total of the (A) to the (C), the drying property after the water development of the photosensitive layer 16 is excellent.

The (D) photopolymerizable compounds are compounds having photopolymerizable functional groups and are cured by light such as ultraviolet rays. The photosensitive layer 16 includes the photopolymerizable compounds and thereby cured portions are formed. The photopolymerizable functional groups of the photopolymerizable compounds may be acryloyl groups, methacryloyl groups or the like.

The (D) photopolymerizable compounds include the following (d1) to (d3). A monofunctional photopolymerizable compound is a compound having one photopolymerizable functional group in the molecule. A bifunctional photopolymerizable compound is a compound having two photopolymerizable functional groups in the molecule.

(d1) a photopolymerizable compound of a chain structure having no cyclic structure (d2) a monofunctional photopolymerizable compound having a cyclic structure (d3) a bifunctional photopolymerizable compound having a cyclic structure Because the above (d1) has a chain structure, the above (d1) moves easily in the photosensitive layer 16. Therefore, the above (d1) can move to a surface side of the photosensitive layer 16 to harden the surface (an outer shell) at the time of the light curing of the photosensitive layer 16. Thereby, surface hardness of the photosensitive layer 16 can be adjusted to desired hardness. On the other hand, the amount of the above (d1) on an inner side decreases due to the movement to the surface side, and thus hardness of the inner side is lower than the hardness of the surface side, and strength easily becomes insufficient. Thereby, the relief images are easily chipped at the time of ink wiping after the flexographic printing plate is produced and printing is performed. By increasing an amount of the above (d1) above a predetermined amount, the hardness of the inner side is also increased, and the above chipping of the relief images can be suppressed; however, along with this, plate hardness becomes too high, and thus the printing properties deteriorate. That is, if the photopolymerizable compound is only the above (d1), the above chipping of the relief images cannot be suppressed while maintaining the printing properties. In addition, because the above (d1) has a chain structure, molecules are easily deformed due to molecular motion in the photosensitive layer 16. In this way, by increasing the amount of the above (d1) above the predetermined amount, curing shrinkage becomes large, ruggedness (curvature) caused by the shrinkage is formed on the surface, and the printing properties deteriorate.

The above (d2) and the above (d3) both have a cyclic structure and have a rigid and bulky structure. The above (d2) and the above (d3) are harder to move in the photosensitive layer 16 than the above (d1) due to the bulkiness thereof. Therefore, the above (d2) and the above (d3) do not harden the surface (the outer shell) at the time of the light curing of the photosensitive layer 16; however, a hardness difference between the surface side and the inner side can be reduced. In addition, mechanical strength can be increased by the rigid structure. Furthermore, the deformation of the molecules caused by the molecular motion can be reduced by the rigid structure, and the curing shrinkage can be reduced.

However, if the photopolymerizable compound is only the above monofunctional (d2) having a cyclic structure, sufficient hardness cannot be obtained, and the above chipping of the relief images cannot be suppressed. In addition, if the photopolymerizable compound is only the above bifunctional (d3) having a cyclic structure, the plate becomes too hard and the printing properties deteriorate. Besides, if the photopolymerizable compounds are only the above (d1) and the above (d2), the hardness of the inner side cannot be increased, and the above chipping of the relief images cannot be suppressed. In addition, if the photopolymerizable compounds are only the above (d1) and the above (d3), the plate hardness is too high and the printing properties deteriorate. In addition, if the photopolymerizable compounds are only the above (d2) and the above (d3), the surface (the outer shell) cannot be sufficiently hardened at the time of the light curing of the photosensitive layer 16, and the printing properties deteriorate.

In the disclosure, when blending a predetermined amount of the photopolymerizable compounds, drawbacks of each other are compensated by combining the above (d1) to (d3), and the above chipping of the relief images can be suppressed while maintaining the printing properties. The printing properties are related to the surface curing, the plate hardness, the curing shrinkage and the like. By being excellent in the surface curing after the light curing, shaving of halftone dots at the time of the printing can be suppressed. In addition, the plate hardness after the light curing does not become too high (flexibility of the rubber is secured), and thereby follow-up capability to a printed object is secured. By suppressing the curing shrinkage at the time of the light curing, surface curvature such as halftone dots or fine lines can be suppressed, and a phenomenon that fine line edges, solid edges or the like of the image is whitened out can be suppressed.

A total amount of the above (d1) to (d3) is preferably within a range of 7.5 to 19 mass % with respect to an entire amount of the photosensitive layer 16 from the viewpoint of excellent curability, excellent strength of the photosensitive layer 16, or the like. Besides, a content of the above (d1) is preferably within a range of 38 to 67 mass % with respect to the total amount of the above (d1) to (d3) from the viewpoint of excellent surface curing after the light curing or the like. In addition, a content of the above (d2) is preferably within a range of 12 to 46 mass % with respect to the total amount of the above (d1) to (d3) from the viewpoint of not becoming too hard after the light curing and securing flexibility even after the light curing. In addition, a content of the above (d3) is preferably within a range of 9 to 46 mass % with respect to the total amount of the above (d1) to (d3) from the viewpoint of being excellent in an effect of suppressing the chipping of the relief images and not becoming too hard after the light curing.

In the above (d1), the chain structure may be either of a linear chain or a branched chain. The above (d1) may be a compound in which a photopolymerizable functional group is bonded to a chain hydrocarbon group. The chain hydrocarbon group may be a group having a carbon number of 1 to 20. In particular, from the viewpoint of easily moving in the photosensitive layer 16 and improving the surface curing after the light curing or the like, the chain hydrocarbon group preferably has a carbon number of 4 to 12. More preferably, the carbon number is 6 to 12. The above (d1) is preferably a compound in which one or two photopolymerizable functional groups are bonded to a chain hydrocarbon group having a carbon number of 4 to 12. More preferably, the carbon number is 6 to 12. In addition, from the viewpoint of improving the surface curing after the light curing, the above (d1) is preferably a (bifunctional) compound in which two photopolymerizable functional groups are bonded to a chain hydrocarbon group having a carbon number of 4 to 12. More preferably, the carbon number is 6 to 12.

The above (d1) may be a compound represented by the following formula (1).

(1)

In the formula (1), $R^1$ represents a hydrogen group or a methyl group, $R^2$ represents a hydrogen group or a methyl group, and $R^3$ represents a linear or branched hydrocarbon group having a carbon number of 4 to 12.

The above (d1) may be a photopolymerizable compound in which a chain structure is a linear chain, such as 1,4-butanediol diacrylate, 1,4-butanediol dimethacrylate, 1,6-hexanediol diacrylate, 1,6-hexanediol dimethacrylate, 1,9- nonanediol diacrylate, 1,9-nonanediol dimethacrylate, 1,10-decanediol diacrylate, 1,10-decanediol dimethacrylate, 1,12-dodecanediol diacrylate, 1,12-dodecanediol dimethacrylate, or a photopolymerizable compound in which a chain structure is a branched chain, such as 1,3-butanediol diacrylate, 1,3-butanediol dimethacrylate, isononanediol diacrylate, isononanediol dimethacrylate, neopentyl glycol diacrylate, neopentyl glycol dimethacrylate. One of these compounds may be included alone or two or more compounds may be included as the above (d1). In particular, 1,3-butanediol diacrylate, 1,3-butanediol dimethacrylate, 1,4-butanediol diacrylate, 1,4-butanediol dimethacrylate, 1,6-hexanediol diacrylate, 1,6-hexanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, and 1,12-dodecanediol dimethacrylate are particularly preferable.

In the above (d2) and the above (d3), the cyclic structure may be a cycloalkane ring, a cycloalkene ring, an aromatic ring, a heterocyclic ring or the like. The cycloalkane ring may be a cyclopropane ring, a cyclobutane ring, a cyclopentane ring, a cyclohexane ring, a cycloheptane ring, a cyclooctane ring, a dicyclopentane ring, a bornane ring, an adamantane ring or the like. The cycloalkene ring may be a cyclopentene ring, a cyclohexene ring, a cycloheptene ring, a cyclooctene ring, a dicyclopentene ring or the like. The aromatic ring may be a benzene ring, a naphthalene ring or the like. The heterocyclic ring may be a tetrahydrofuran ring, a furan ring or the like.

The above (d2) may be a compound represented by the following formula (2).

In the formula (2), $R^4$ represents a hydrogen group or a methyl group, and $R^5$ represents a cyclic structure composed of hydrocarbon or a cyclic structure composed of carbon, hydrogen and oxygen. $R^5$ preferably represents a cyclic structure composed of hydrocarbon.

The above (d2) may be an acrylate such as cyclohexyl acrylate, cyclopentanyl acrylate, cyclohexanyl acrylate, dicyclopentanyl acrylate, dicyclopentanyl oxyethyl acrylate, isobornyl acrylate, 3-hydroxy-1-adamantyl acrylate, 3,5-dihydroxy-1-adamantyl acrylate, 2-methyl-2-adamantyl acrylate, 2-ethyl-2-adamantyl acrylate, 2-isopropyl-2-adamantyl acrylate, cyclopentenyl acrylate, [5-(1-hydroxy-1-methyl ethyl) adamantyl]-1-methyl ethyl acrylate, cyclohexenyl acrylate, dicyclopentenyl acrylate, dicyclopentenyl oxyethyl acrylate, phenyl acrylate, 9-anthrylmethyl acrylate, benzyl acrylate, phenoxethyl acrylate, tetrahydrofurfuryl acrylate, furfuryl acrylate, glycidyl acrylate, 2,4,6-tribromo phenyl acrylate, pentafluorophenyl acrylate, pentafluorobenzyl acrylate, glycidyl acrylate, 4-methyl-2-oxotetrahydro-2H-pyrane-4-yl acrylate, 2-morpholinoethyl acrylate, N-succinimidyl acrylate, 1,2,2,6,6-pentamethyl-4-piperidyl acrylate, 2,2,6,6-tetramethyl-4-piperidyl acrylate, 2,2,6,6-tetramethyl piperidine-1-oxyl free radical acrylate, 11-[4-(4-butylphenylazo) phenoxy] undecyl acrylate or the like, or a methacrylate such as cyclohexyl methacrylate, cyclopentanyl methacrylate, cyclohexanyl methacrylate, dicyclopentanyl methacrylate, dicyclopentanyl oxyethyl methacrylate, isobornyl methacrylate, 3-hydroxy-1-adamantyl methacrylate, 3,5-dihydroxy-1-adamantyl methacrylate, [5-(1-hydroxy-1-methyl ethyl) adamantyl]-1-methyl ethyl methacrylate, 2-methyl-2-adamantyl methacrylate, 2-ethyl-2-adamantyl methacrylate, 2-isopropyl-2-adamantyl methacrylate, cyclopentenyl methacrylate, cyclohexenyl methacrylate, dicyclopentenyl methacrylate, dicyclopentenyl oxyethyl methacrylate, phenyl methacrylate, 9-anthrylmethyl acrylate, benzyl methacrylate, phenoxethyl methacrylate, tetrahydrofurfuryl methacrylate, furfuryl methacrylate, glycidyl methacrylate, 2,4,6-tribromo phenyl methacrylate, pentafluorophenyl methacrylate, pentafluorobenzyl methacrylate, glycidyl methacrylate, 4-methyl-2-oxotetrahydro-2H-pyrane-4-yl methacrylate, 2-morpholinoethyl methacrylate, N-succinimidyl methacrylate, 1,2,2,6,6-pentamethyl-4-piperidyl methacrylate, 2,2,6,6-tetramethyl-4-piperidyl methacrylate, 2,2,6,6-tetramethyl piperidine-1-oxyl free radical methacrylate, 11-[4-(4-butyl phenyl azo) phenoxy] undecyl methacrylate or the like. In addition, the above (d2) may be an acrylamide such as N-[4-cyano-3-(trifluoromethyl) phenyl] acrylamide, N-(4-hydroxyphenyl) acrylamide, 3-mephenyl boronic acid acrylamide, N-phenyl acrylamide or the like, or a methacrylamide such as N-[4-cyano-3-(trifluoromethyl) phenyl] methacrylamide, N-(4-hydroxyphenyl) methacrylamide, 3-mephenyl boronic acid methacrylamide, N-phenyl methacrylamide or the like. One of these compounds may be included alone or two or more compounds may be included as the above (d2). In particular, from the viewpoint of suppressing the movement of the monomers at the time of the light curing and making the cured state uniform or the like, the isobornyl acrylate, the isobornyl methacrylate, the dicyclopentanyl acrylate, and the dicyclopentanyl methacrylate are particularly preferable.

The above (d3) may be a compound represented by the following formula (3).

In the formula (3), $R^6$ represents a hydrogen group or a methyl group, $R^7$ represents a hydrogen group or a methyl group, and $R^8$ represents a cyclic structure composed of hydrocarbon or a cyclic structure composed of carbon, hydrogen and oxygen. $R^8$ preferably represents a cyclic structure composed of hydrocarbon.

The above (d3) may be an acrylate such as tricyclodecane dimethanol diacrylate, 9,9-bis[4-(2-hydroxyethoxy) phenyl] fluorene diacrylate, 1,3-adamantyl diacrylate, 5-hydroxy-1,3-adamantyl diacrylate, 1,3-(1-methyl ethyl) adamantyl diacrylate or the like, or a methacrylate such as tricyclodecane dimethanol dimethacrylate, 9,9-bis[4-(2-hydroxyethoxy) phenyl] fluorene dimethacrylate, 1,3-adamantyl dimethacrylate, 5-hydroxy-1,3-adamantyl dimethacrylate, 1,3-(1-methyl ethyl) adamantyl dimethacrylate or the like. One of these compounds may be included alone or two or more compounds may be included as the above (d3). In particular, from the viewpoint of suppressing the movement of the monomers at the time of the light curing and making the cured state uniform, achieving an excellent shrinkage property (low shrinkage) from low molecular freedom, or the like, the tricyclodecane dimethanol diacrylate and the tricyclodecane dimethanol dimethacrylate are particularly preferable.

The (E) photopolymerization initiator is not particularly limited as long as the compound starts photopolymerization of the photopolymerizable compounds, and the photopolymerization initiator may be, for example, alkylphenone photopolymerization initiators, acetophenone photopolymerization initiators, benzoin ether photopolymerization initiators, benzophenone photopolymerization initiators, thioxanthone photopolymerization initiators, anthraquinone photopolymerization initiators, benzyl photopolymerization initiators, biacetyl photopolymerization initiators or the like. Specifically, the photopolymerization initiator may be, for example, benzyl dimethylketal, 2-hydroxy-2-methyl-1-phenyl-propane-1-one, methyl-O-benzoyl benzoate, 1-hydroxycyclohexylphenyl ketone or the like.

A content of the photopolymerization initiator in the photosensitive layer 16 is not particularly limited and is preferably a comparatively high concentration. Thereby, the surface curability is excellent, and high image quality and high definition are achieved easily. For example, with respect to the entire amount of the photosensitive layer 16, the content of the photopolymerization initiator is preferably 0.3 mass % or more. More preferably, the content is 0.5 mass % or more. In addition, from the viewpoint that exposure time is easy to adjust because sensitivity is not too high, with respect to the entire amount of the photosensitive layer 16, the content of the photopolymerization initiator is preferably 8.0 mass % or less. More preferably, the content is 5.0 mass % or less.

In the photosensitive composition of the photosensitive layer 16, from the viewpoint of increasing thermal stability at the time of kneading the composition, increasing storage stability or the like, a thermal polymerization inhibitor can be added. The thermal polymerization inhibitor may be, for example, phenol thermal polymerization inhibitors, hydroquinone thermal polymerization inhibitors, catechol thermal polymerization inhibitors or the like. A content of the thermal polymerization inhibitor in the photosensitive layer 16 is generally within a range of 0.001 to 5.0 mass %.

The photosensitive layer 16 can include a plasticizer for the purpose of applying flexibility or the like. The plasticizer may be liquid rubber, oil, polyester, phosphate compound or the like. The liquid rubber may be liquid polybutadiene, liquid polyisoprene, or the rubber obtained by modifying these compounds with maleic acid or an epoxy group, or the like. The oil may be paraffin, naphthene, aromatic oil or the like. The polyester may be adipic acid polyester or the like. The phosphate compound may be phosphate ester or the like. The plasticizer preferably has good compatibility with binder polymers.

A content of the plasticizer in the photosensitive layer 16 is preferably within a range of 0.1 to 30 mass % with respect to the entire amount of the photosensitive layer 16. More preferably, the content of the plasticizer is within a range of 5 to 20 mass %. If the content of the plasticizer is 0.1 mass % or more, an effect of applying flexibility is excellent, and an effect of suppressing swelling of the photosensitive layer 16 caused by solvent ink is excellent. That is, resistance to the solvent ink (solvent ink swelling resistance) is improved. In addition, if the content of the plasticizer is 30 mass % or more, the strength of the photosensitive layer 16 can be secured.

In addition, in a range where the effects of the disclosure are not inhibited, the photosensitive layer 16 may further include, for the purpose of improving various properties, other components such as an ultraviolet absorber, a dye, a pigment, an antifoaming agent, a perfume or the like.

The composition of the photosensitive layer 16 can be prepared, for example, by dehydrating each component while kneading. Alternatively, the composition of the photosensitive layer 16 can be prepared by kneading the polymer obtained from the water-dispersed latex and components other than the polymer after the water-dispersed latex is dehydrated in advance. A kneader used at the time of the kneading may be a twin screw extruder, a single screw extruder, a kneader, a banbury mixer or the like.

According to the flexographic printing plate precursor 10 having the above configuration, because the photosensitive layer 16 which uses a mixture of the water-dispersed latex and the millable rubber has a low strength at an interface between the water-dispersed latex and the rubber, there is a problem that the relief images are easily chipped at the time of ink wiping after the flexographic printing plate is produced and printing is performed; however, because the photosensitive layer 16 includes the (A) water-dispersed latex, the (B) millable rubber, the (C) surfactant, the (D) photopolymerizable compounds, and the (E) photopolymerization initiator, the (D) including the above (d1) to (d3), the chipping of the relief images can be suppressed while maintaining the printing properties.

The flexographic printing plate precursor according to the disclosure may be a printing plate precursor of a so-called analog type in which a negative film (in which an image is already formed) is adhered to the photosensitive layer during use, or a printing plate precursor of a so-called LAM (Laser ablation mask) type included in a CTP (Computer to plate) type in which an infrared ablation layer is adhered onto the photosensitive layer in advance.

In the printing plate precursor of the analog type, the adhesive layer composed of the adhesive agent or the like for adhering the substrate and the photosensitive layer, the photosensitive layer, an anti-adhesion layer for preventing the photosensitive layer surface from adhering, and a protective film which prevents scratches of the photosensitive layer before use are laminated on the substrate in this order. Furthermore, for the printing plate precursor of the analog type, the protective film is peeled off during use, and the negative film in which the image is formed in advance is adhered onto the exposed anti-adhesion layer.

As for the printing plate precursor of the analog type, for example, the adhesive agent is coated on one surface of the substrate in advance, an anti-adhesion agent is coated on one surface of the protective film in advance, the composition of the photosensitive layer is sandwiched between the substrate on which the adhesive agent is coated in advance and the protective film on which the anti-adhesion agent is coated in advance, and pressing is performed so that a thickness of the photosensitive layer becomes a predefined thickness, thereby producing the printing plate precursor of the analog type.

Compared with the printing plate precursor of the analog type, the printing plate precursor of the LAM type is different in having an infrared ablation layer between the photosensitive layer and the protective film, and other configurations are the same as the configurations of the printing plate precursor of the analog type. That is, in the printing plate precursor of the LAM type, the adhesive layer, the photosensitive layer, the infrared ablation layer, and the protective film are laminated on the substrate in this order. For the printing plate precursor of the LAM type, the protective film is peeled off during use, and the infrared ablation layer is exposed.

The infrared ablation layer is a layer in which the part irradiated by infrared laser can be removed, and is a layer that has a function of blocking transmission of the ultraviolet rays at a practical level and can serve as a negative (or positive) film by forming an image thereon.

The infrared ablation layer is mainly configured by a resin or a rubber which is a binder, an infrared ray absorbing substance, an ultraviolet ray absorbing substance, a plasticizer or the like. The infrared ablation layer can be produced, for example, by dissolving the above material in a solvent, coating the solution on a base material, and then drying to remove the solvent.

As for the printing plate precursor of the LAM type, for example, the adhesive agent is coated on one surface of the substrate in advance, an infrared ablation layer is coated on one surface of the protective film in advance, the composition of the photosensitive layer is sandwiched between the substrate on which the adhesive agent is coated in advance and the protective film on which the infrared ablation layer is coated in advance, and pressing is performed so that a thickness of the photosensitive layer becomes a predefined thickness.

In any printing plate precursor, the thickness of the photosensitive layer is preferably within a range of 0.01 to 10 mm. If the thickness of the photosensitive layer is 0.01 mm or more, relief depth can be sufficiently secured. On the other hand, if the thickness of the photosensitive layer is 10 mm or less, weight of the printing plate precursor can be suppressed and the printing plate precursor can be practically used as a printing plate.

The flexographic printing plate is composed using the flexographic printing plate precursor according to the disclosure. That is, the flexographic printing plate is composed by forming the relief images on the photosensitive layer of the flexographic printing plate precursor according to the disclosure.

In order to form the relief images on the photosensitive layer of the flexographic printing plate precursor, first, ultraviolet rays are irradiated from a substrate side of the flexographic printing plate precursor (back exposure).

When the printing plate precursor of the analog type is used, the protective film is peeled off, and the negative film in which the image is formed in advance is adhered to the exposed anti-adhesion layer. On the other hand, when the printing plate precursor of the LAM type is used, the protective film is peeled off, and a desired image is formed by irradiating the exposed infrared ablation layer with the infrared laser.

Next, by irradiating the ultraviolet rays from above the negative film or the infrared ablation layer, the photosensitive layer is cured (main exposure). The ultraviolet rays usually can be irradiated by a high pressure mercury lamp, a ultra-high pressure mercury lamp, a metal halide lamp, a xenon lamp, a carbon arc lamp, a chemical lamp or the like which can irradiate light having a wavelength of 300 to 400 nm. On the photosensitive layer, by irradiating the ultraviolet rays, an irradiated part is cured. On the photosensitive layer covered by the negative film or the infrared ablation layer, the cured part to which the ultraviolet rays are irradiated and the uncured part to which the ultraviolet rays are not irradiated are generated.

Next, by removing the uncured part of the photosensitive layer in the developing liquid, the relief images are formed. An aqueous developing liquid is used as the developing liquid. The aqueous developing liquid is composed by adding a surfactant, a PH adjuster or the like into water as necessary. The uncured part of the photosensitive layer can be removed, for example, by washing the uncured part using a spray type development device, a brush type washing machine or the like.

Next, the printing plate material is taken out from the developing liquid and dried. Then, the ultraviolet rays are irradiated on the whole dried printing plate material as necessary (back exposure). Thereby, the flexographic printing plate is obtained.

Implementation Examples

The disclosure is specifically described below by implementation examples, but the disclosure is not limited to these implementation examples.

Implementation Examples 1-26, Comparison Examples 1-11

<Preparation of Composition of Photosensitive Layer>

Moisture of water dispersion of the water-dispersed latex is evaporated for two hours by a dryer heated to 120° C., and a polymer is obtained from the water dispersion of the water-dispersed latex. Next, with the blending composition (parts by mass) according to table 1, the polymer (solid matter), a millable rubber, a surfactant, a photopolymerization initiator, and photopolymerizable compounds are kneaded in a kneader for 45 minutes, and the composition of the photosensitive layer is obtained.

<Production of Infrared Ablation Layer/Protective Film Lamination Body>

28.8 parts by mass of carbon black (made by Mitsubishi Chemical Corporation, MA8), 28.8 parts by mass of acrylic resin (made by Negami Industrial Co., Ltd., Hi Pearl M4501), and 4.5 parts by mass of a plasticizer (made by Wako Pure Chemical Industrial Co., Ltd., O-acetyl tributyl citrate) are added into 105.2 parts by mass of methyl isobutyl ketone and are mixed by blade agitating. The obtained mixture is dispersed using a three-roller mill, methyl isobutyl ketone is further added in a manner that the solid matter is 15 mass % to obtain a paint. Next, the paint is coated on a PET film having a thickness of 100 μm by a bar coater in a manner that a thickness of the coating film after drying is 2 μm, and the coating film is dried at 120° C. for 5 minutes, thereby obtaining an infrared ablation layer/a protective film lamination body.

<Production of Flexographic Printing Plate Precursor>

The composition of the photosensitive layer is sandwiched between a substrate where the adhesive agent is coated in advance on one surface of a PET film having a thickness of 125 μm and a protective film where the infrared ablation layer is coated in advance on one surface of a PET film having a thickness of 100 μm, and pressing is performed by a presser heated to 120° C. in a manner that a thickness of the photosensitive layer is 1 mm, and thereby flexographic printing plate precursor is produced in which the adhesive layer, the photosensitive layer, the infrared ablation layer, and the protective film are laminated in this order on the substrate.

<Production of Flexographic Printing Plate 1>

From the substrate side of the produced flexographic printing plate precursor, exposure (back exposure) is performed for 30 seconds from a distance of 15 cm by an exposure device in which 15 chemical lamps of 20 W are arranged in parallel. Thereafter, the protective film is peeled off, a pattern (a pattern 1 having 10 independent points of a size of ϕ500 μm) is formed on the infrared ablation layer by infrared laser, and thereby a negative film is formed, and exposure (main exposure) is performed for 10 minutes from a distance of 15 cm by the above exposure device from above the formed negative film. Thereafter, the negative film is removed, and development is performed for 5 minutes with a brush type washing machine (liquid temperature 50° C.) containing water. Thereafter, drying is performed with hot air at 60° C. until moisture is removed. Thereafter, exposure (back exposure) is performed for 10 minutes from a distance of 15 cm by the above exposure device from above the photosensitive layer, and thereby the flexographic printing plate 1 having 10 independent points of a size of φ500 μm is obtained.

<Production of Flexographic Printing Plate 2>

When the pattern is formed on the infrared ablation layer, except that a pattern 2 having halftone dots "175|pi2%" is formed instead of the pattern 1, a flexographic printing plate 2 in which the halftone dots "175|pi2%" are formed is obtained in the same way as the flexographic printing plate 1.

<Production of Flexographic Printing Plate 3>

When the pattern is formed on the infrared ablation layer, except that a pattern 3 having fine lines with a width of 200 μm is formed instead of the pattern 1, a flexographic printing plate 3 in which the fine lines with a width of 200 μm are formed is obtained in the same way as the flexographic printing plate 1.

Components of the composition of the photosensitive layer are specifically shown below.

(A) water-dispersed latex: polymer obtained from "Nipol LX111NF" made by Zeon Corporation (B) millable rubber (BR): "Nipol BR1220" made by Zeon Corporation (C) surfactant: [made by Kao, Emal 0]

(D) photopolymerizable compounds (d1) chain bifunctional monomer (NK Ester NOD-N): 1,9-nonanediol dimethacrylate [made by shin-nakamura chemical Co., Ltd.] (linear chain)

(d1) chain bifunctional monomer (NK Ester HD-N): 1,6-hexanediol dimethacrylate [made by shin-nakamura chemical Co., Ltd.] (linear chain)

(d1) chain bifunctional monomer (NK Ester BG): 1,3-butanediol dimethacrylate [made by shin-nakamura chemical Co., Ltd.] (branched chain)

(d1) chain bifunctional monomer (DDMA): 1,12-dodecanediol dimethacrylate [made by Tokyo Chemical Industry Co., Ltd.] (linear chain)

(d2) cyclic monofunctional monomer (IB-X): isobornyl methacrylate [made by Kyoeisha Chemical Co., Ltd.] (aliphatic ring)

(d2) cyclic monofunctional monomer (DCPM): dicyclopentanyl oxyethyl methacrylate [made by Tokyo Chemical Industry Co., Ltd.] (aliphatic ring)

(d2) cyclic monofunctional monomer (BZM): benzyl methacrylate [made by Tokyo Chemical Industry Co., Ltd.] (aromatic ring)

(d2) cyclic monofunctional monomer (CHMA): cyclohexylmethacrylate [made by Tokyo Chemical Industry Co., Ltd.] (aliphatic ring)

(d2) cyclic monofunctional monomer (THFM): tetrahydrofurfuryl methacrylate [made by Tokyo Chemical Industry Co., Ltd.] (heterocyclic ring)

(d3) cyclic bifunctional monomer (NK Ester DCP): tricyclodecane dimethanol dimethacrylate [made by shin-nakamura chemical Co., Ltd.] (aliphatic ring)

(d3) cyclic bifunctional monomer (HAMA): 5-hydroxy-1,3-adamantyl dimethacrylate [made by Mitsubishi Gas Chemical Company, Inc.] (aliphatic ring)

(E) photopolymerization initiator: "Omnirad651" made by BASF Japan Co., Ltd.

Whether chipping is generated easily in convex portions being independent points is evaluated using the produced flexographic printing plate 1. In addition, in relation to the evaluation of whether chipping is generated easily in the convex portions, the composition of the photosensitive layer is used to measure tensile rupture stress of a light curing object of the composition. In addition, durability of the dot portion is evaluated using the produced flexographic printing plate 2. In addition, in order to evaluate TEV/fine line reproducibility (elastic modulus), the composition of the photosensitive layer is used to measure Shore A hardness of the light curing object of the composition. In addition, TEV/fine line reproducibility (surface curvature property) is evaluated using the produced flexographic printing plate 3. Results of these evaluations are shown in tables 1 to 4.

(Chipping of Convex Portions)

Mechanical strength of a character portion at the time of ink wiping after printing is evaluated by a model experiment. Specifically, using a Taber abrasion tester (made by Yasuda-seiki Seisakusho, Ltd., abrasion wheel: a resin abrasion wheel wrapped by cloth, weight: 1 kg), a plate surface of the flexographic printing plate 1 having 10 independent points of φ500 μm size is rubbed five times with only one wheel, and a degree of destruction is observed with a microscope. One point is got when the convex portion being an independent point is completely chipped, and 0.7 point is got when the convex portion is partially chipped. A case in which a total score of the 10 independent points is 8.0 points or more is defined as "x" in which chipping is generated easily, and a case in which the total score of the 10 independent points is less than 8.0 is defined as "○" in which chipping is hard to generate. In addition, a case in which the tensile rupture stress is 4.00 N/mm$^2$ or more is considered as a case in which chipping is hard to generate.

(Dot Portion Durability)

Using a Taber abrasion tester (made by Yasuda-seiki Seisakusho, Ltd., abrasion wheel: CS-10, weight: 0.5 kg), a plate surface of the flexographic printing plate 2 having halftone dots "175|pi2%" is rubbed 20 times with two wheels, and a degree of destruction is observed with a microscope, thereby evaluating dot portion durability at the time of printing. A case in which the dot portion is shaved is defined as defective "x", and a case in which the dot portion is not shaved is defined as good "○".

(TEV/Fine Line Reproducibility (Elastic Modulus))

The follow-up capability of the flexographic printing plate to the printed object is an important factor in this performance. The follow-up capability is greatly related to the plate hardness of the flexographic printing plate. Therefore, the Shore A hardness of the light curing object of the composition of the photosensitive layer is measured, and a case in which the Shore A hardness is 75 or less is defined as good "○", and a case in which the Shore A hardness is beyond 75 is defined as defective "x".

(TEV/Fine Line Reproducibility (Surface Curvature Property))

A cross section with a fine line shape of the flexographic printing plate 3 in which the fine lines with a width of 200 μm are formed is observed with a laser microscope ("VK-X210" made by Keyence corporation, objective lens 50 times), and the surface curvature property is judged by a difference in heights (a shrinkage amount) between an end portion and a center portion. A case in which the shrinkage amount is 5.0 μm or less is defined as a case of "○" in which the curvature is small, and a case in which the shrinkage amount is 5.1 μm or less is defined as a case of "x" in which the curvature is large.

A case in which both the TEV/fine line reproducibility (the elastic modulus) and the TEV/fine line reproducibility (the surface curvature property) are "○" is considered to be excellent in TEV/fine line reproducibility, and a case in which either one is "x" is considered to be inferior.

(Shore a Hardness)

The Shore A hardness of the light curing object of the composition of the photosensitive layer is measured in conformity to JIS K6253. The exposure device and the exposure time are in accordance with the production of the flexographic printing plate 1.

(Tensile Rupture Stress)

The tensile rupture stress of the light curing object of the composition of the photosensitive layer is measured in conformity to JIS K6251. The exposure device and the exposure time are in accordance with the production of the flexographic printing plate 1.

TABLE 1

|   |   | Implementation example |   |   |   |   |   |   |   |   |
|---|---|---|---|---|---|---|---|---|---|---|
|   |   | 1 | 2 | 3 | 4 | 5 | 6 | 7 | 8 | 9 |
| A | Water-dispersed latex | 30 | 30 | 30 | 30 | 30 | 30 | 30 | 30 | 30 |
| B | Millable rubber | 10 | 10 | 10 | 10 | 10 | 10 | 10 | 10 | 10 |
| C | Surfactant | 2.0 | 2.0 | 2.0 | 2.0 | 2.0 | 2.0 | 2.0 | 2.0 | 2.0 |
| d1 | Chain bifunctional monomer (NOD-N) | 8.0 | 7.0 | 6.0 | 5.0 | 7.0 | 7.0 | 6.0 | 6.0 | 6.0 |
| d1 | Chain bifunctional monomer (HD-N) | — | — | — | — | — | — | — | — | — |
| d1 | Chain bifunctional monomer (BG) | — | — | — | — | — | — | — | — | — |
| d1 | Chain bifunctional monomer (DDMA) | — | — | — | — | — | — | — | — | — |
| d2 | Cyclic monofunctional monomer (IB-X) | 2.5 | 2.5 | 2.5 | 2.5 | 3.5 | 1.5 | 4.5 | 3.5 | 1.5 |
| d2 | Cyclic monofunctional monomer (DCPM) | — | — | — | — | — | — | — | — | — |
| d2 | Cyclic monofunctional monomer (BZM) | — | — | — | — | — | — | — | — | — |
| d2 | Cyclic monofunctional monomer (CHMA) | — | — | — | — | — | — | — | — | — |
| d2 | Cyclic monofunctional monomer (THFM) | — | — | — | — | — | — | — | — | — |
| d3 | Cyclic bifunctional monomer (DCP) | 1.5 | 2.5 | 3.5 | 4.5 | 1.5 | 3.5 | 1.5 | 2.5 | 4.5 |
| d3 | Cyclic bifunctional monomer (HAMA) | — | — | — | — | — | — | — | — | — |
| E | Photopolymerization initiator | 4.5 | 4.5 | 4.5 | 4.5 | 4.5 | 4.5 | 4.5 | 4.5 | 4.5 |
|   | D = d1 + d2 + d3 | 12.0 | 12.0 | 12.0 | 12.0 | 12.0 | 12.0 | 12.0 | 12.0 | 12.0 |
|   | d1/D (mass %) | 66.7 | 58.3 | 50.0 | 41.7 | 58.3 | 58.3 | 50.0 | 50.0 | 50.0 |
|   | d2/D (mass %) | 20.8 | 20.8 | 20.8 | 20.8 | 29.2 | 12.5 | 37.5 | 29.2 | 12.5 |
|   | d3/D (mass %) | 12.5 | 20.8 | 29.2 | 37.5 | 12.5 | 29.2 | 12.5 | 20.8 | 37.5 |
| Evaluation | Convex portion chipping | ○ | ○ | ○ | ○ | ○ | ○ | ○ | ○ | ○ |
|   | Dot portion durability | ○ | ○ | ○ | ○ | ○ | ○ | ○ | ○ | ○ |
|   | TEV/fine line reproducibility elastic modulus | ○ | ○ | ○ | ○ | ○ | ○ | ○ | ○ | ○ |
|   | surface curvature | ○ | ○ | ○ | ○ | ○ | ○ | ○ | ○ | ○ |
|   | Tensile rupture stress | 5.33 | 5.83 | 5.45 | 5.77 | 5.92 | 6.23 | 5.49 | 4.56 | 5.93 |
|   | Shore A hardness | 71.0 | 71.0 | 71.7 | 74.0 | 69.3 | 71.7 | 69.3 | 69.7 | 72.0 |
|   | Shrinkage amount | 3.8 | 4.9 | 3.6 | 2.3 | 3.6 | 3.7 | 2.9 | 4.9 | 2.8 |

TABLE 2

|   |   | Implementation example |   |   |   |   |   |   |   |   |
|---|---|---|---|---|---|---|---|---|---|---|
|   |   | 10 | 11 | 12 | 13 | 14 | 15 | 16 | 17 | 18 |
| A | Water-dispersed latex | 30 | 30 | 30 | 30 | 30 | 30 | 30 | 30 | 30 |
| B | Millable rubber | 10 | 10 | 10 | 10 | 10 | 10 | 10 | 10 | 10 |
| C | Surfactant | 2.0 | 2.0 | 2.0 | 2.0 | 2.0 | 2.0 | 2.0 | 2.0 | 2.0 |
| d1 | Chain bifunctional monomer (NOD-N) | 5.0 | 5.0 | 5.0 | 5.0 | 7.0 | 7.0 | 6.0 | 6.0 | 6.0 |
| d1 | Chain bifunctional monomer (HD-N) | — | — | — | — | — | — | — | — | — |
| d1 | Chain bifunctional monomer (BG) | — | — | — | — | — | — | — | — | — |
| d1 | Chain bifunctional monomer (DDMA) | — | — | — | — | — | — | — | — | — |

TABLE 2-continued

|  |  | Implementation example | | | | | | | | |
|---|---|---|---|---|---|---|---|---|---|---|
|  |  | 10 | 11 | 12 | 13 | 14 | 15 | 16 | 17 | 18 |
| d2 | Cyclic monofunctional monomer (IB-X) | 1.5 | 3.5 | 4.5 | 5.5 | 3.0 | 2.0 | 4.0 | 3.0 | 2.0 |
| d2 | Cyclic monofunctional monomer (DCPM) | — | — | — | — | — | — | — | — | — |
| d2 | Cyclic monofunctional monomer (BZM) | — | — | — | — | — | — | — | — | — |
| d2 | Cyclic monofunctional monomer (CHMA) | — | — | — | — | — | — | — | — | — |
| d2 | Cyclic monofunctional monomer (THFM) | — | — | — | — | — | — | — | — | — |
| d3 | Cyclic bifunctional monomer (DCP) | 5.5 | 3.5 | 2.5 | 1.5 | 1.0 | 2.0 | 1.0 | 2.0 | 3.0 |
| d3 | Cyclic bifunctional monomer (HAMA) | — | — | — | — | — | — | — | — | — |
| E | Photopolymerization initiator | 4.5 | 4.5 | 4.5 | 4.5 | 4.5 | 4.5 | 4.5 | 4.5 | 4.5 |
|  | D = d1 + d2 + d3 | 12 | 12 | 12 | 12 | 11 | 11 | 11 | 11 | 11 |
|  | d1/D (mass %) | 41.7 | 41.7 | 41.7 | 41.7 | 63.6 | 63.6 | 54.5 | 54.5 | 54.5 |
|  | d2/D (mass %) | 12.5 | 29.2 | 37.5 | 45.8 | 27.3 | 18.2 | 36.4 | 27.3 | 18.2 |
|  | d3/D (mass %) | 45.8 | 29.2 | 20.8 | 12.5 | 9.1 | 18.2 | 9.1 | 18.2 | 27.3 |
| Evaluation | Convex portion chipping | ○ | ○ | ○ | ○ | ○ | ○ | ○ | ○ | ○ |
|  | Dot portion durability | ○ | ○ | ○ | ○ | ○ | ○ | ○ | ○ | ○ |
|  | TEV/fine line reproducibility elastic modulus | ○ | ○ | ○ | ○ | ○ | ○ | ○ | ○ | ○ |
|  | surface curvature | ○ | ○ | ○ | ○ | ○ | ○ | ○ | ○ | ○ |
|  | Tensile rupture stress | 7.01 | 5.75 | 4.89 | 5.01 | 5.50 | 5.39 | 5.11 | 4.56 | 4.79 |
|  | Shore A hardness | 73.7 | 71.7 | 69.7 | 70.3 | 69.0 | 61.7 | 68.7 | 69.3 | 70.3 |
|  | Shrinkage amount | 2.5 | 1.8 | 2.1 | 2.6 | 3.0 | 4.7 | 2.5 | 3.4 | 2.0 |

TABLE 3

|  |  | Implementation example | | | | | | | |
|---|---|---|---|---|---|---|---|---|---|
|  |  | 19 | 20 | 21 | 22 | 23 | 24 | 25 | 26 |
| A | Water-dispersed latex | 30 | 30 | 30 | 30 | 30 | 30 | 30 | 30 |
| B | Millable rubber | 10 | 10 | 10 | 10 | 10 | 10 | 10 | 10 |
| C | Surfactant | 2.0 | 2.0 | 2.0 | 2.0 | 2.0 | 2.0 | 2.0 | 2.0 |
| d1 | Chain bifunctional monomer (NOD-N) | 6.0 | 6.0 | 6.0 | 6.0 | 6.0 | — | — | — |
| d1 | Chain bifunctional monomer (HD-N) | — | — | — | — | — | 6.0 | — | — |
| d1 | Chain bifunctional monomer (BG) | — | — | — | — | — | — | 6.0 | — |
| d1 | Chain bifunctional monomer (DDMA) | — | — | — | — | — | — | — | 6.0 |
| d2 | Cyclic monofunctional monomer (IB-X) | — | — | — | — | 3.5 | 3.5 | 3.5 | 3.5 |
| d2 | Cyclic monofunctional monomer (DCPM) | 3.5 | — | — | — | — | — | — | — |
| d2 | Cyclic monofunctional monomer (BZM) | — | 3.5 | — | — | — | — | — | — |
| d2 | Cyclic monofunctional monomer (CHMA) | — | — | 3.5 | — | — | — | — | — |
| d2 | Cyclic monofunctional monomer (THFM) | — | — | — | 3.5 | — | — | — | — |
| d3 | Cyclic bifunctional monomer (DCP) | 2.5 | 2.5 | 2.5 | 2.5 | — | 2.5 | 2.5 | 2.5 |
| d3 | Cyclic bifunctional monomer (HAMA) | — | — | — | — | 2.5 | — | — | — |
| E | Photopolymerization initiator | 4.5 | 4.5 | 4.5 | 4.5 | 4.5 | 4.5 | 4.5 | 4.5 |
|  | D = d1 + d2 + d3 | 12 | 12 | 12 | 12 | 12 | 12 | 12 | 12 |
|  | d1/D (mass %) | 50.0 | 50.0 | 50.0 | 50.0 | 50.0 | 50.0 | 50.0 | 50.0 |
|  | d2/D (mass %) | 29.2 | 29.2 | 29.2 | 29.2 | 29.2 | 29.2 | 29.2 | 29.2 |
|  | d3/D (mass %) | 20.8 | 20.8 | 20.8 | 20.8 | 20.8 | 20.8 | 20.8 | 20.8 |
| Evaluation | Convex portion chipping | ○ | ○ | ○ | ○ | ○ | ○ | ○ | ○ |
|  | Dot portion durability | ○ | ○ | ○ | ○ | ○ | ○ | ○ | ○ |
|  | TEV/fine line reproducibility elastic modulus | ○ | ○ | ○ | ○ | ○ | ○ | ○ | ○ |
|  | surface curvature | ○ | ○ | ○ | ○ | ○ | ○ | ○ | ○ |
|  | Tensile rupture stress | 6.13 | 5.30 | 4.31 | 4.26 | 4.56 | 4.75 | 5.08 | 4.42 |
|  | Shore A hardness | 64.0 | 62.6 | 68.7 | 67.7 | 69.7 | 70.3 | 71.7 | 68.7 |
|  | Shrinkage amount | 3.3 | 3.8 | 4.0 | 3.4 | 3.6 | 5.0 | 4.8 | 4.6 |

TABLE 4

| | | Comparison example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| A | Water-dispersed latex | 30 | 30 | 30 | 30 | 30 | 30 | 30 | 30 | 30 | 30 | 30 |
| B | Millable rubber | 10 | 10 | 10 | 10 | 10 | 10 | 10 | 10 | 10 | 10 | 10 |
| C | Surfactant | 2 | 2 | 2 | 2 | 2 | 2 | 2 | 2 | 2 | 2 | 2 |
| d1 | Chain bifunctional monomer (NOD-N) | 8.7 | 10 | 13.1 | 12 | — | — | — | — | — | 7.75 | 7.25 |
| d1 | Chain bifunctional monomer (HD-N) | — | — | — | — | — | — | — | — | — | — | — |
| d1 | Chain bifunctional monomer (BG) | — | — | — | — | — | — | — | — | — | — | — |
| d1 | Chain bifunctional monomer (DDMA) | — | — | — | — | — | — | — | — | — | — | — |
| d2 | Cyclic monofunctiona monomer (IB-X) | — | — | — | — | 12 | — | — | — | 6.5 | — | 4.75 |
| d2 | Cyclic monofunctional monomer (DCPM) | — | — | — | — | — | — | — | — | — | — | — |
| d2 | Cyclic monofunctional monomer (BZM) | — | — | — | — | — | — | — | — | — | — | — |
| d2 | Cyclic monofunctional monomer (CHMA) | — | — | — | — | — | — | — | — | — | — | — |
| d2 | Cyclic monofunctional monomer (THFM) | — | — | — | — | — | — | — | — | — | — | — |
| d3 | Cyclic bifunctional monomer (DCP) | — | — | — | — | — | 12 | 10 | 8.0 | 5.5 | 4.25 | — |
| d3 | Cyclic bifunctional monomer (HAMA) | — | — | — | — | — | — | — | — | — | — | — |
| E | Photopolymerization initiator | 4.5 | 4.5 | 4.5 | 4.5 | 4.5 | 4.5 | 4.5 | 4.5 | 4.5 | 4.5 | 4.5 |
| | D = d1 + d2 + d3 | 8.7 | 10 | 13.1 | 12 | 12 | 12 | 10 | 8.0 | 12 | 12 | 12 |
| | d1/D (mass %) | 100 | 100 | 100 | 100 | 0 | 0 | 0 | 0 | 0.0 | 64.6 | 60.4 |
| | d2/D (mass %) | 0 | 0 | 0 | 0 | 100 | 0 | 0 | 0 | 54.2 | 0 | 39.6 |
| | d3/D (mass %) | 0 | 0 | 0 | 0 | 0 | 100 | 100 | 100 | 45.8 | 35.4 | 0 |
| Evaluation | Convex portion chipping | x | x | ○ | ○ | x | ○ | ○ | ○ | ○ | ○ | x |
| | Dot portion durability | ○ | ○ | x | x | x | ○ | x | x | x | ○ | ○ |
| | TEV/fine line reproducibility | ○ | ○ | x | x | ○ | x | x | ○ | ○ | x | ○ |
| | elastic modulus surface curvature | ○ | ○ | x | x | ○ | ○ | ○ | ○ | ○ | ○ | ○ |
| | Shore A hardness | 68.7 | 74.1 | 75.3 | 75.1 | 65.8 | 78.8 | 75.8 | 74.1 | 72.8 | 75.8 | 68.7 |
| | Shrinkage amount | 2.3 | 3.5 | 6.0 | 6.6 | 1.8 | 3.4 | 3.1 | 2.8 | 2.9 | 4.0 | 3.8 |

According to the implementation examples and the comparison examples, when the photosensitive layer includes the (A) water-dispersed latex, the (B) millable rubber, the (C) surfactant, the (D) photopolymerizable compounds, and the (E) photopolymerization initiator, and the (D) includes all of the above (d1) photopolymerizable compound of a chain structure having no cyclic structure, the above (d2) monofunctional photopolymerizable compound having a cyclic structure, and the above (d3) bifunctional photopolymerizable compound having a cyclic structure, the chipping of the relief images can be suppressed while maintaining the printing properties.

As for the comparison examples 1 and 2, because the (D) is composed of the above (d1) only, although the surface curing is excellent and the dot portion durability is satisfied, internal hardness is low and the convex portions are chipped. As shown in the comparison examples 3 and 4, if an amount of the above (d1) is greater than a predefined amount, although chipping of the convex portions is suppressed, the surface curing progresses too much, the dot portion durability and the TEV/fine line reproducibility deteriorate, and the printing properties are not satisfied. In addition, the curing shrinkage increases, and thereby the TEV/fine line reproducibility also deteriorates.

As for the comparison example 5, because the (D) is composed of the above (d2) only, sufficient hardness is not obtained and the convex portions are chipped. In addition, because the surface curing is also inferior, the dot portion durability is not satisfied either. As for the comparison example 6, because the (D) is composed of the above (d3) only, the flexographic printing plate becomes too hard, the TEV/fine line reproducibility deteriorates, and the printing properties are not satisfied. As shown in the comparison examples 7 and 8, if the amount of the above (d3) is smaller than the predefined amount, although the hardness is suppressed, because the surface curing is inferior, the dot portion durability is not satisfied.

As for the comparison example 9, because the (D) is composed of the above (d2) and the above (d3), although the chipping of the convex portions is suppressed, the surface curing is inferior, and thus the dot portion durability is not satisfied. As for the comparison example 10, because the (D) is composed of the above (d1) and the above (d3), the flexographic printing plate becomes too hard, the TEV/fine line reproducibility deteriorates, and the printing properties are not satisfied. As for the comparison example 11, because the (D) is composed of the above (d1) and the above (d2), although the surface curing is excellent and the dot portion durability is satisfied, internal hardness is low and the convex portions are chipped.

The flexographic printing plate precursor according to the disclosure has a photosensitive layer, wherein the photosensitive layer includes (A) a water-dispersed latex, (B) a millable rubber, (C) a surfactant, (D) photopolymerizable compounds, and (E) a photopolymerization initiator, and the (D) including the following (d1) to (d3).

(d1) a photopolymerizable compound of a chain structure having no cyclic structure (d2) a monofunctional photopolymerizable compound having a cyclic structure

(d3) a bifunctional photopolymerizable compound having a cyclic structure The above (d1) may be a compound in which one or two photopolymerizable functional groups are bonded to a chain hydrocarbon group having a carbon number of 4 to 12. In addition, the above (d1) may be a compound represented by the following formula (1). In addition, the above (d1) may be at least one compound selected from 1,3-butanediol diacrylate, 1,3-butanediol dimethacrylate, 1,4-butanediol diacrylate, 1,4-butanediol dimethacrylate, 1,6-hexanediol diacrylate, 1,6-hexanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, and 1,12-dodecanediol dimethacrylate.

In the formula (1), $R^1$ represents a hydrogen group or a methyl group, $R^2$ represents a hydrogen group or a methyl group, and $R^3$ represents a linear or branched hydrocarbon group having a carbon number of 4 to 12.

The above (d2) may be a compound represented by the following formula (2). In addition, the above (d2) may be isobornyl acrylate or isobornyl methacrylate.

In the formula (2), $R^4$ represents a hydrogen group or a methyl group, and $R^5$ represents a cyclic structure composed of hydrocarbon or a cyclic structure composed of carbon, hydrogen and oxygen. $R^5$ preferably represents a cyclic structure composed of hydrocarbon.

The above (d3) may be a compound represented by the following formula (3). The above (d3) is preferably tricyclodecane dimethanol diacrylate or tricyclodecane dimethanol dimethacrylate.

In the formula (3), $R^6$ represents a hydrogen group or a methyl group, $R^7$ represents a hydrogen group or a methyl group, and $R^8$ represents a cyclic structure composed of hydrocarbon or a cyclic structure composed of carbon, hydrogen and oxygen. $R^8$ preferably represents a cyclic structure composed of hydrocarbon.

A total amount of the above (d1) to (d3) is preferably within a range of 7.5 to 19 mass % with respect to an entire amount of the photosensitive layer. A content of the above (d1) is preferably within a range of 38 to 67 mass % with respect to the total amount of the above (d1) to (d3). A content of the above (d2) is preferably within a range of 12 to 46 mass % with respect to the total amount of the above (d1) to (d3). A content of the above (d3) is preferably within a range of 9 to 46 mass % with respect to the total amount of the above (d1) to (d3). The above (d1) is preferably a compound in which one or two photopolymerizable functional groups are bonded to a chain hydrocarbon group having a carbon number of 4 to 12.

Effect

According to the flexographic printing plate precursor of the disclosure, because the photosensitive layer includes (A) the water-dispersed latex, (B) the millable rubber, (C) the surfactant, (D) the photopolymerizable compounds, and (E) the photopolymerization initiator, and the (D) includes the above (d1) to (d3), the chipping of the relief images can be suppressed while maintaining the printing properties.

In the above, the embodiments of the disclosure are specifically described, but the disclosure is not limited to any one of the above embodiments, and various modifications are possible in a range not departing from the gist of the disclosure.

What is claimed is:
1. A flexographic printing plate precursor, comprising:
a photosensitive layer, comprising (A) a water-dispersed latex, (B) a millable rubber, (C) a surfactant, (D) photopolymerizable compounds, and (E) a photopolymerization initiator,
wherein the (D) comprises following (d1) to (d3), and the (d1) is a compound represented by formula (1) and the (d2) is a compound represented by formula (2),
(d1) a photopolymerizable compound of a chain structure having no cyclic structure,
(d2) a monofunctional photopolymerizable compound having a cyclic structure, and
(d3) a bifunctional photopolymerizable compound having a cyclic structure, wherein the (d3) is tricyclodecane dimethanol diacrylate or tricyclodecane dimethanol dimethacrylate, in the formula (1), $R^1$ represents a hydrogen group or a methyl group, $R^2$ represents a hydrogen group or a methyl group, and $R^3$ represents a linear or branched hydrocarbon group having a carbon number of 4 to 12, in the formula (2), $R^4$ represents a hydrogen group or a methyl group, and $R^5$ represents a cyclic structure composed of hydrocarbon or a cyclic structure composed of carbon, hydrogen and oxygen, wherein a total amount of the (d1) to (d3) is within a range of 7.5 to 19 mass % with respect to an entire amount of the photosensitive layer, a content of the (d1) is within a range of 38 to 67 mass % with respect to the total amount of the (d1) to (d3), a content of the (d2) is within a range of 12 to 46 mass % with respect to the total amount of the (d1) to (d3), and a content of the (d3) is within a range of 9 to 46 mass % with respect to the total amount of the (d1) to (d3).

2. The flexographic printing plate precursor according to claim 1, wherein the (d1) is a compound in which one or two photopolymerizable functional groups are bonded to a chain hydrocarbon group having a carbon number of 4 to 12.

3. The flexographic printing plate precursor according to claim 1, wherein the (d1) is at least one compound selected from 1,3-butanediol diacrylate, 1,3-butanediol dimethacrylate, 1,4-butanediol diacrylate, 1,4-butanediol dimethacrylate, 1,6-hexanediol diacrylate, 1,6-hexanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, and 1,12-dodecanediol dimethacrylate.

4. The flexographic printing plate precursor according to claim 1, wherein the $R^5$ represents a cyclic structure composed of hydrocarbon.

5. The flexographic printing plate precursor according to claim 1, wherein the (d2) is isobornyl acrylate or isobornyl methacrylate.

* * * * *